US008362783B2

(12) United States Patent
Baker et al.

(10) Patent No.: US 8,362,783 B2
(45) Date of Patent: Jan. 29, 2013

(54) METHOD FOR VERIFYING A COMPLETENESS OF AN ANTENNA

(75) Inventors: Tracy M. Baker, Belle Center, OH (US); Kevin J. Salm, Minster, OH (US); Terry A. Richardson, Urbana, OH (US)

(73) Assignee: AGC Automotive Americas Co., Hebron, KY (US)

( * ) Notice: Subject to any disclaimer, the term of this patent is extended or adjusted under 35 U.S.C. 154(b) by 696 days.

(21) Appl. No.: 12/548,879

(22) Filed: Aug. 27, 2009

(65) Prior Publication Data

US 2010/0052718 A1    Mar. 4, 2010

Related U.S. Application Data

(60) Provisional application No. 61/190,286, filed on Aug. 27, 2008.

(51) Int. Cl.
*G01R 31/00* (2006.01)
(52) U.S. Cl. ........................................ 324/505; 324/503
(58) Field of Classification Search ........... 324/503–505
See application file for complete search history.

(56) References Cited

U.S. PATENT DOCUMENTS

| | | | |
|---|---|---|---|
| 3,911,357 A | 10/1975 | Adam | |
| 4,095,172 A | 6/1978 | Strand | |
| 4,276,509 A | 6/1981 | Bryant et al. | |
| 4,409,541 A * | 10/1983 | Richards | 324/505 |
| 4,905,261 A * | 2/1990 | Knight | 377/19 |
| 5,208,543 A | 5/1993 | Albiniak | |
| 5,337,004 A * | 8/1994 | Murakami et al. | 324/505 |
| 5,666,065 A | 9/1997 | Ravas et al. | |
| 5,864,319 A * | 1/1999 | Paulus | 343/703 |
| 6,288,552 B1 | 9/2001 | Palmgren | |
| 6,313,799 B1 | 11/2001 | Thimm et al. | |
| 6,614,922 B1 | 9/2003 | Walton | |
| 7,123,876 B2 * | 10/2006 | Wang et al. | 455/25 |
| 7,148,698 B2 | 12/2006 | Becker et al. | |
| 7,456,796 B2 | 11/2008 | Nagayama et al. | |
| 7,471,092 B2 | 12/2008 | Amanuma et al. | |
| 7,472,028 B2 | 12/2008 | Foote | |
| 7,478,298 B2 | 1/2009 | Jaworski et al. | |
| 2008/0169990 A1 | 7/2008 | Taniguchi et al. | |
| 2008/0309565 A1 | 12/2008 | Villarroel et al. | |

* cited by examiner

*Primary Examiner* — Joshua Benitez Rosario
(74) *Attorney, Agent, or Firm* — Howard & Howard Attorneys PLLC

(57) ABSTRACT

A method verifies a completeness of an antenna disposed on a window. The antenna is electrically conductive and has a first end and a second end spaced from each other. The method comprises the step of placing the window on a fixture for supporting the window. The method also includes the steps of automatically aligning a distributing probe and the first end of the antenna and automatically aligning a receiving probe and the second end of the antenna. The method further includes the step of activating a current source to pass an electrical current from the distributing probe to the receiving probe through the antenna. The method also includes the step of indicating passage of the electrical current from the antenna to the receiving probe with the indicator to verify a completeness of the antenna.

26 Claims, 7 Drawing Sheets

US 8,362,783 B2

METHOD FOR VERIFYING A COMPLETENESS OF AN ANTENNA

RELATED APPLICATIONS

This application claims priority to and all advantages of U.S. Provisional Patent Application No. 61/190,286, which was filed on Aug. 27, 2008.

BACKGROUND OF THE INVENTION

1. Field of the Invention

The subject invention generally relates to a method of verifying a completeness of an antenna and, more specifically, to a method of verifying the completeness of an antenna disposed on a window.

2. Description of the Related Art

The incorporation of an antenna onto a window of a vehicle has been widely used by vehicle manufacturers. The antenna may be designed for receiving a radio signal in an FM frequency and/or an AM frequency. Typically, the antenna is arranged on the window in a pattern including a series of lines. Conventional methods for disposing the antenna on the window can result in defects in a completeness of the antenna, such as inconsistency in line width and/or gaps in the line which reduces the effectiveness of the antenna and/or prevents the antenna from receiving the radio signal. Generally, antennas with poor or ineffective radio signal reception are considered defective and the window should not be installed on a vehicle.

With an increased demand in quality control it has become necessary to verify the completeness of the antenna prior to installing the window in the vehicle. Current antenna verification procedures for verifying the completeness of antennas generally require manual testing of an electrical continuity of the antenna. Testing the electrical continuity of the antenna ensures the antenna is capable of forming a complete or closed circuit when a current is introduced. If the antenna is capable of forming the closed circuit, then the antenna is complete and is able to receive the radio signals.

Current antenna verification procedures for verifying the completeness of the antenna are very labor and time intensive. That is, a technician must manually test the electrical continuity of the antenna. This often prohibits the testing of every antenna manufactured to confirm the antenna is in working condition. As such, only a random sampling of the windows manufactured are tested which results in windows with defective antennas being shipped for installation in the vehicles.

Accordingly, it would be advantageous to develop an improved antenna verification system and method.

SUMMARY OF THE INVENTION AND ADVANTAGES

The subject invention provides a method of verifying a completeness of an antenna disposed on a window. The antenna is electrically conductive and has a first end and a second end spaced from each other. The method uses an antenna verification system which comprises a fixture for supporting the window. The antenna verification system also comprises a current source for generating an electrical current and at least one distributing probe in electrical communication with the current source for electrically communicating with the first end of the antenna and. The antenna verification system further comprises at least one receiving probe for electrically communicating with the second end of the antenna and an indicator in electrical communication with the receiving probe for indicating passage of the electrical current from the antenna to the receiving probe.

The method comprises the step of placing the window on the fixture. The method also includes the steps of automatically aligning the distributing probe and the first end of the antenna, and automatically aligning the receiving probe and the second end of the antenna. The method further includes the steps of activating the current source such that the electrical current passes from the distributing probe to the receiving probe through the antenna and indicating passage of the electrical current from the antenna to the receiving probe with the indicator to verify a completeness of the antenna.

Accordingly, the present invention has several advantages over the previous antenna verification procedures. One such advantage is the antenna verification system can be incorporated into an assembly line. Another advantage is the antenna verification system reduces the labor and time required to verify the completeness of the antenna thereby allowing every antenna to be verified before shipping the windows to a vehicle manufacturer and/or installed on a vehicle.

BRIEF DESCRIPTION OF THE DRAWINGS

Other advantages of the present invention will be readily appreciated, as the same becomes better understood by reference to the following detailed description when considered in connection with the accompanying drawings wherein.

DETAILED DESCRIPTION OF THE INVENTION

Referring to the Figures, wherein like numerals indicate corresponding parts throughout the several views, an antenna verification system 10 for verifying a completeness of an antenna 12 is generally shown. The completeness of the antenna 12 generally refers to the antenna 12 being continuous and unbroken having a satisfactory width. The completeness of the antenna 12 also refers to the ability of the antenna 12 to receive radio signals. The antenna 12 is electrically conductive as will be described in detail below. Generally, the completeness of the antenna 12 can be verified by indicating an electrical continuity of the antenna 12. It is to be appreciated that the completeness of the antenna 12 can be verified by other methods such as indicating a resistance of the antenna 12 or the impedance of the antenna 12 depending on a type of the current, i.e., direct current or alternating current, without departing from the scope of the present invention.

Figure 1:
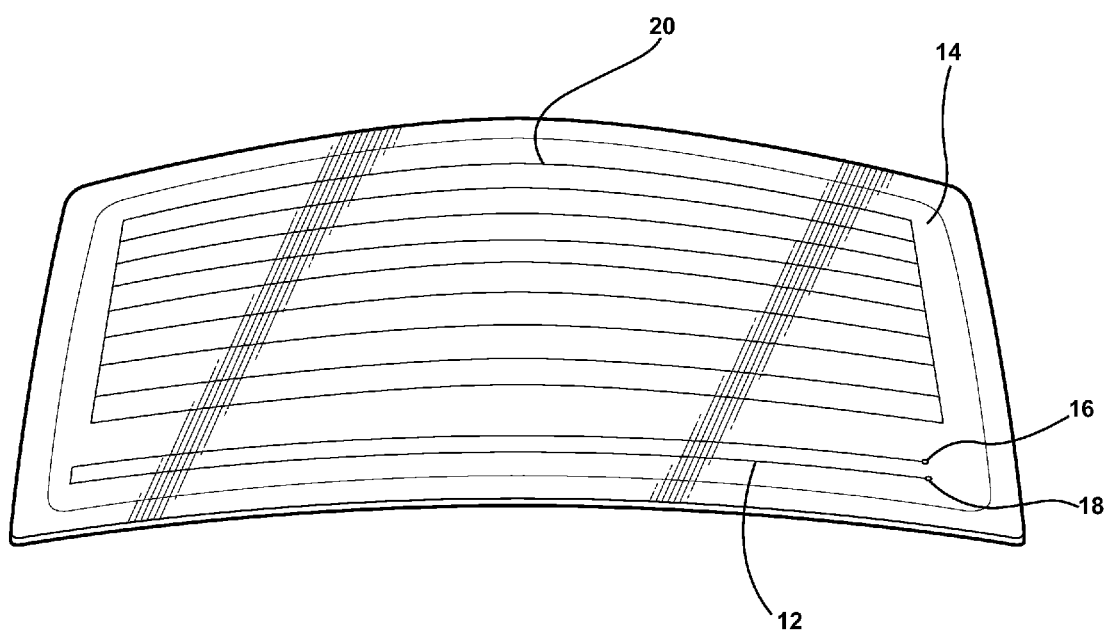
FIG. 1 is a perspective view of an antenna disposed on a window.

Referring to FIG. 1, typically, the antenna 12 is disposed on a window 14 of a vehicle. In other embodiments, the antenna 12 can be disposed on other substrates commonly associated with the vehicle such as a roof, sunroof, and moon roof. The window 14 may have different configurations depending on which vehicle the window 14 will be used in. Typically, the configuration of the window 14 includes the shape, width, length and curvature of the window 14. The antenna verification system 10 may include space sensors for verifying the curvature of the window 14 as is known by those skilled in the art.

The window 14 may include a plurality of antennas 12 for receiving radio signals of various band widths, such as an FM band and/or an AM band. The antenna 12 may also receive a satellite signal. It is to be appreciated that when multiple antennas 12 are disposed on the window 14, each of the antennas 12 can be tested independently, simultaneously or in series using the method described below. Typically, each antenna 12 has a first end 16 and a second end 18 spaced from each other. It is to be appreciated that the pattern may have additional ends without departing from the nature of the present invention. Typically, the antenna 12 is a continuous line extending across the window 14 several times to form a series of parallel lines or pattern extending across the window 14 as generally illustrated in FIG. 1. It is to be appreciated that the antenna verification system 10 can be utilized with any pattern of the antenna 12.

Typically, the antenna 12 is printed on the window 14 and comprises a material that is electrically conductive. As such, the antenna is electrically conductive. Generally, the antenna is electrically conductive for receiving the radio signals and communicating the radio signals to a receiver. An example of the material suitable for the present invention is a silver paste or ink as is known in the art. Generally, when the silver paste is employed, the silver paste must be fired for curing the silver paste to the window 14. It is to be appreciated that the antenna 12 may be formed of any suitable material not described herein that is capable of imparting electrical conductivity to the antenna 12.

A heating element 20 may be disposed on the window 14 for heating a portion of the window 14. It is to be appreciated that the heating element 20, when present, may be a separate pattern on the window 14 adjacent to the antenna 12 or may be incorporated within the antenna 12, such that the antenna 12 provides the functions of both the heating element 20 and the antenna 12 without departing from the scope of the present invention. The heating element 20 may comprise the material of the antenna 12 such that the heating element 20 is also electrically conductive. As a result, a completeness of the heating element 20 can be tested simultaneously with the antenna 12 using the antenna verification system 10 and the method described below.

Like the heating element 20, an anti-theft line may also be disposed on the window 14. Typically, the anti-theft line is also electrically conductive and a completeness of the anti-theft line can be verified using the antenna verification system 10 and the method described below.

Figure 2:
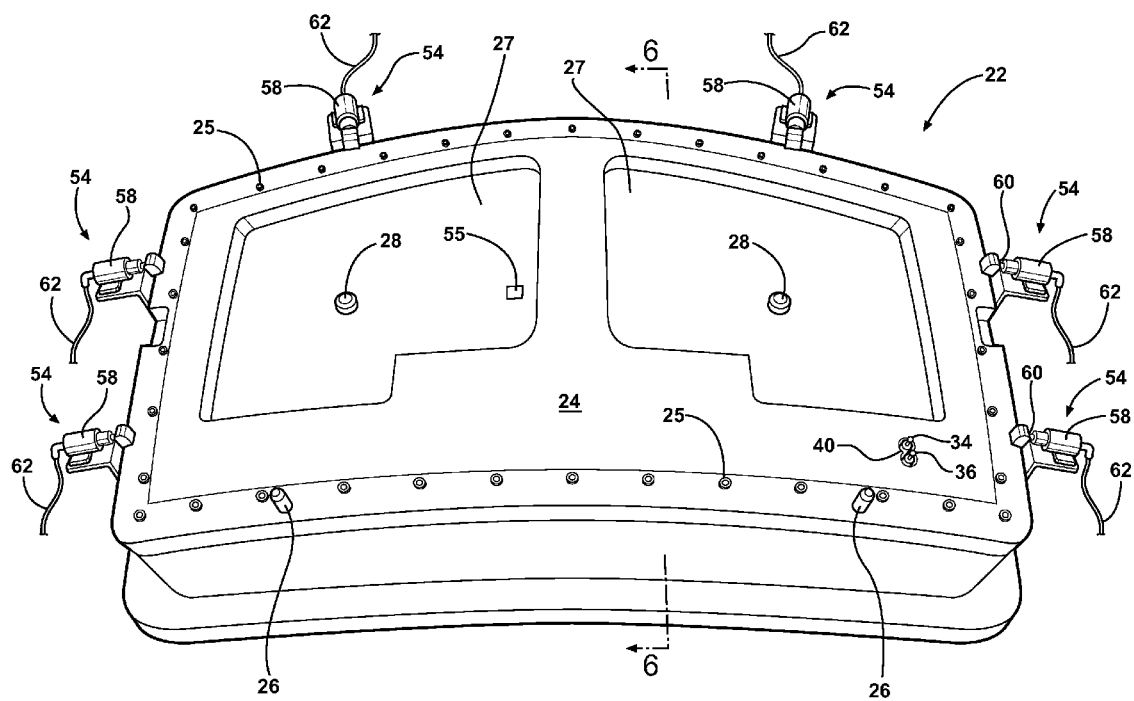
FIG. 2 is a perspective view of a portion of an antenna verification system having a fixture, at least one an adjustment mechanism, and distributing and receiving probes.

Referring to FIG. 2, the antenna verification system 10 includes a fixture 22 for supporting the window 14. Typically, the window 14 is aligned in a test position on the fixture 22 prior to verifying the completeness of the antenna 12, which will be described in detail below. Typically, the fixture 22 includes a plurality of legs for supporting the fixture 22. However, it is to be appreciated that the fixture 22 may be supported by any suitable method. For example, the fixture 22 may be disposed on a floor or table. The fixture 22 has a contact surface 24 having a configuration that resembles the configuration of the window 14 such that the contact surface 24 supports the window 14. Although not required, a plurality of pins 25 may extend from the contact surface 24 for supporting the window 14 to simulate installation of the window 14 on the vehicle. It is to be appreciated that the window 14 may be supported in alternative ways without departing from the nature of the subject invention.

Typically, the fixture 22 includes at least one rest 26 extending from the contact surface 24 for assisting with the positioning of the window 14 on the fixture 22 by ensuring consistent placement of an edge of the window 14 on the fixture 22. For example, the edge of the window 14 always contacts the rest 26 as the window 14 is placed on the fixture 22 thereby ensuring the edge of the window 14 is in the same alignment relative to the fixture 22 when placed on the fixture 22, minimizing the adjustment required to move the window 14 into the test position.

Although not required, the fixture 22 may define a hollow interior and include an access panel 27 for allowing access to the hollow interior. When the access panel 27 is employed, at least one handle 28 may be used to secure the access panel 27 to the fixture 22 for preventing separation between the access panel 27 and the fixture 22. When the fixture 22 includes the access panel 27, the contact surface 24 of the fixture 22 may define at least one depression for spacing the access panel 27 from the window 14 thereby providing clearance between the handle 28 and the window 14.

Figure 6:
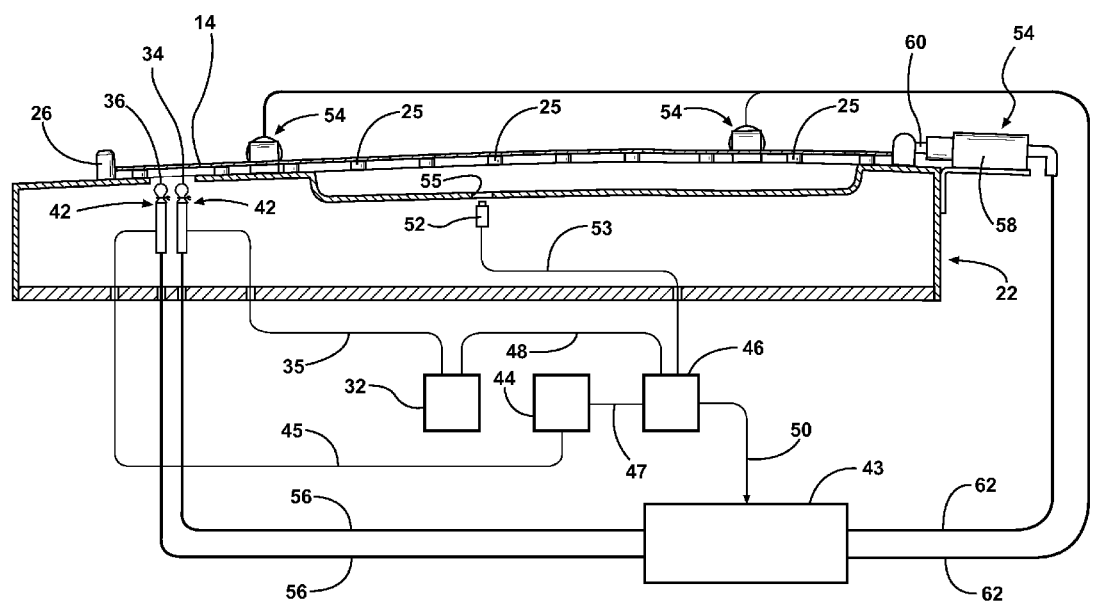
FIG. 6 is a cross-sectional and schematic view of the fixture taken along line 6-6 of FIG. 2.
Figure 7:
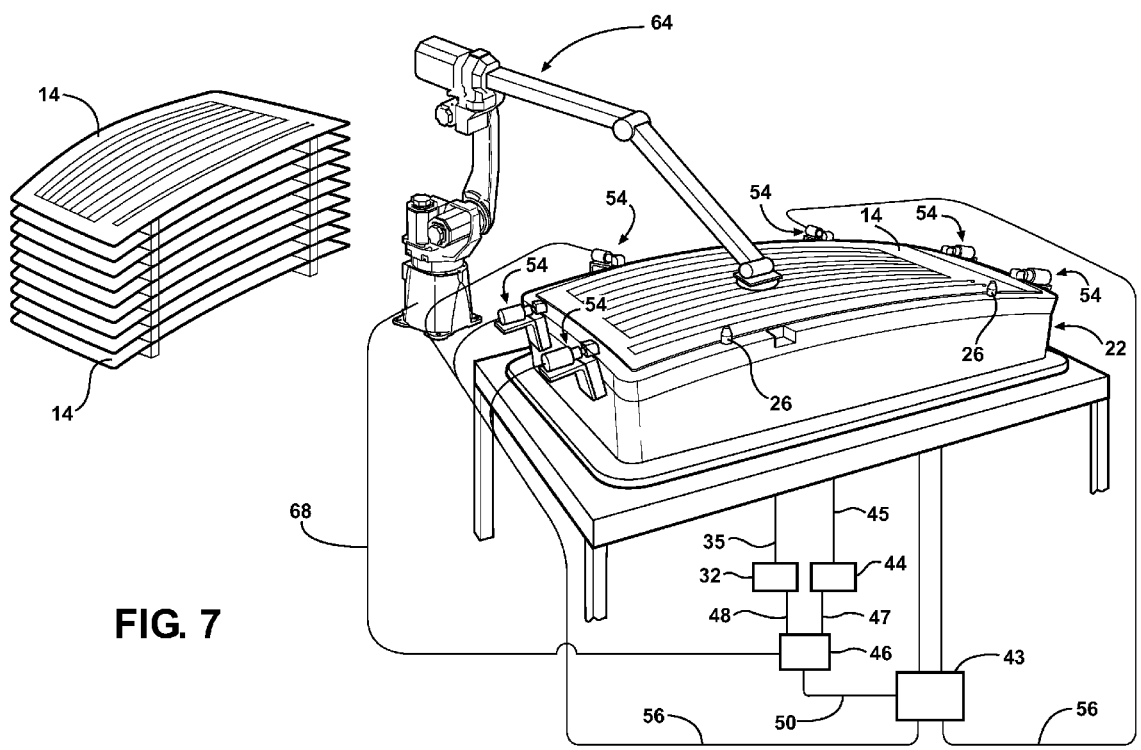
FIG. 7 is a perspective view of one embodiment of the antenna verification system.

Referring to FIGS. 6 and 7, the antenna verification system 10 also includes a current source 32 for generating an electrical current. Typically, the electrical current is the direct current; however, it is to be appreciated that the current source 32 can generate the alternating current without departing from the scope of the present invention. The electrical current has an initial voltage generated by the current source 32 of about 24 volts. It is to be appreciated that the electrical current may have different voltages without departing from the scope of the present invention.

Referring to FIGS. 2, and 3A through 4B, the antenna verification system 10 further includes at least one distributing probe 34 in electrical communication with the current source 32 for electrically communicating with the first end 16 of the antenna 12 to pass the electrical current to the first end 16 of the antenna 12. Typically, a distributing probe wire 35 is used to couple the distributing probe 34 to the current source 32. The antenna verification system 10 also comprises at least one receiving probe 36 for electrically communicating with the second end 18 of the antenna 12 for receiving the electrical current passed through the antenna 12. When the antenna 12 includes the additional ends 16, 18, the antenna verification system 10 includes additional receiving probes 34, 36 for electrically communicating with the additional ends 16, 18. Additionally, when the antenna verification system 10 is used to verify the heating element 20, the antenna verification system 10 typically includes a plurality of the distributing probes 34 and a plurality of the receiving probe 36 for electrically communicating with the heating element 20.

The probes 34, 36 comprise an electrically conductive material for allowing the probes 34, 36 to electrically communicate with the antenna 12 on the window 14. It is to be appreciated that the probes 34, 36 may contact the antenna 12 to electrically communicate with the antenna 12. Alternatively, it is to be appreciated that the probes 34, 36 can eclectically communicate with the antenna 12 without contacting the antenna 12 such that the probes 34, 36 are spaced from the antenna 12. However, contact between the probes 34, 36 and the antenna 12 allows a more accurate verification of the completeness of the antenna 12 as compared to the probes 34, 36 being spaced from the antenna 12. Additionally, contact between the probes 34, 36 and the antenna 12 allows the completeness of the antenna 12 to be verified at a lower voltage than if the probes 34, 36 are spaced from the antenna 12.

Figure 5:
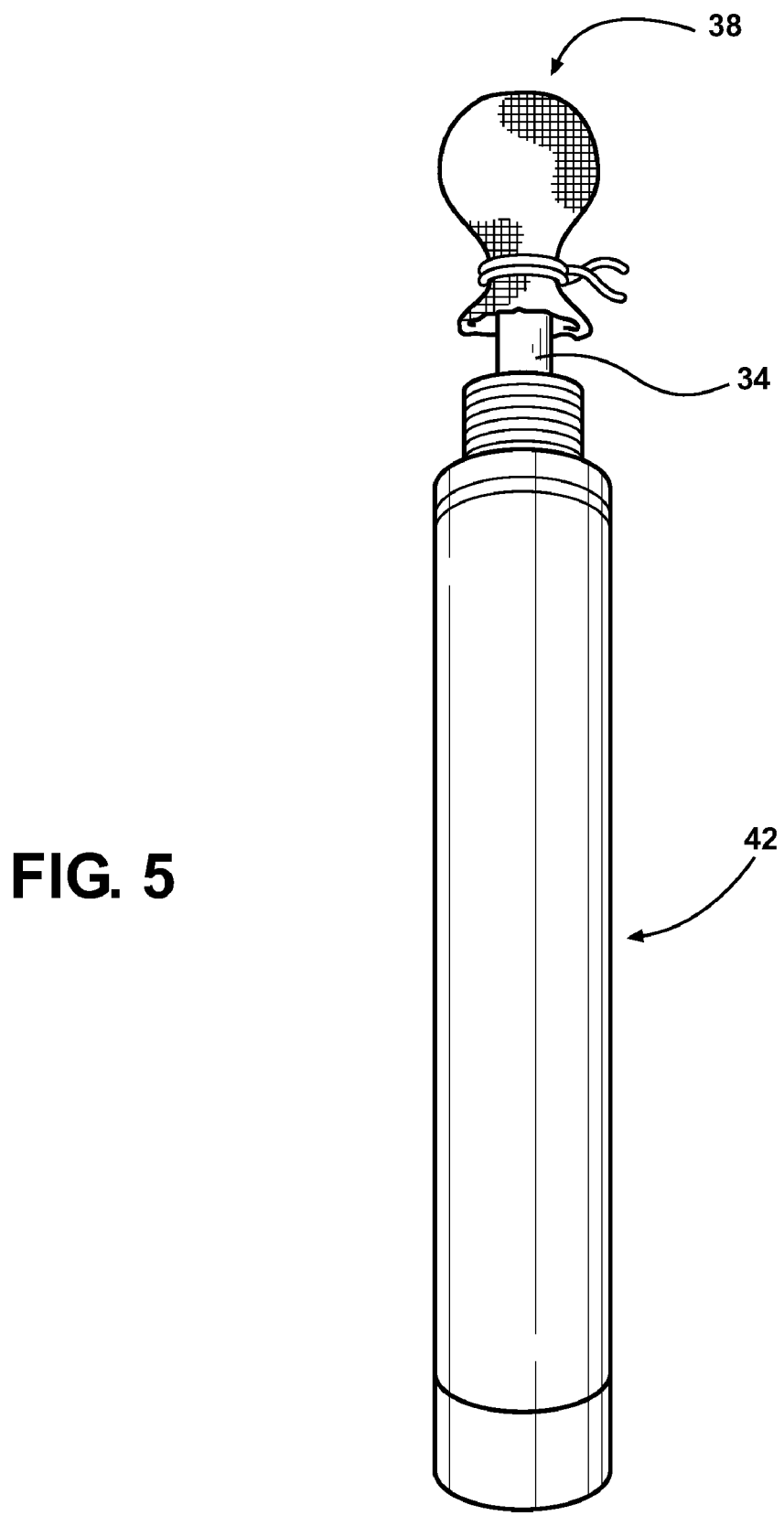
FIG. 5 is a perspective view of one of the probes disposed within a actuator.

Referring to FIG. 5, each of the probes 34, 36 have a contact end 38 for contacting the antenna 12. Typically, the contact end 38 of the probes 34, 36 comprises a non-abrasive material capable of contacting the antenna 12 without damaging the antenna 12 and/or the window 14. For example, the contact end 38 may comprise Naslon. When Naslon is employed on the contact end 38 of the probes 34, 36, the Naslon is typically a gage 0.3 braided Naslon. However, it is to be appreciated that the contact end 38 of the probes 34, 36 may comprise any suitable material without departing from the scope of the present invention.

Figure 3A:
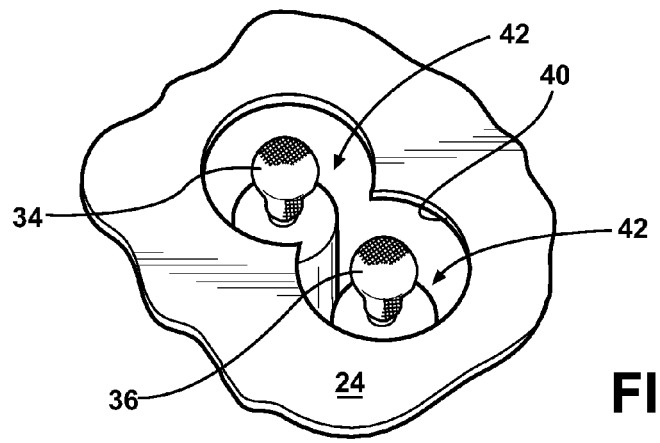
FIG. 3A is a partial perspective view of the fixture with the distributing and receiving probes disposed within the fixture.
Figure 3B:
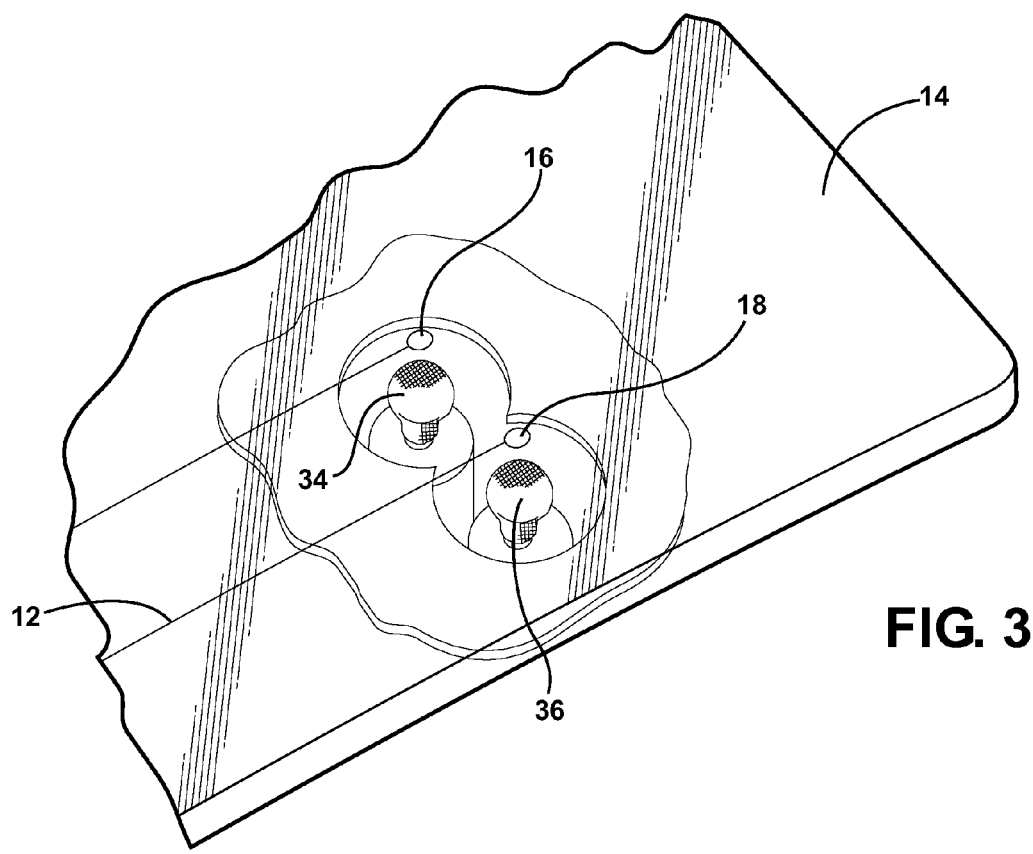
FIG. 3B is a partial perspective view of the window disposed on the fixture with the distributing and receiving probes spaced from the antenna.

Referring to FIGS. 3A through 4B, when the window 14 is in the test position on the fixture 22, the distributing probe 34 is aligned with the first end 16 of the antenna 12 and the receiving probe 36 is aligned with the second end 18 of the antenna 12 as shown in FIG. 3B. It is to be appreciated that the test position of the window 14 is not an exact position and some tolerance of alignment between the window 14 on the fixture 22 and the probes 34, 36 is acceptable. It is also to be appreciated that the window 14 may move relative to the fixture 22 for aligning the probes 34, 36 with the ends 16, 18 of the antenna. Alternatively, the probes 34, 36 may move relative to the fixture 22 for aligning the probes 34, 36 with the ends 16, 18 of the antenna. Furthermore, both the window 14 and the probes 34, 36 may move relative to the fixture 22 for aligning the probes 34, 36 with the ends 16, 18 of the antenna.

Figure 4A:
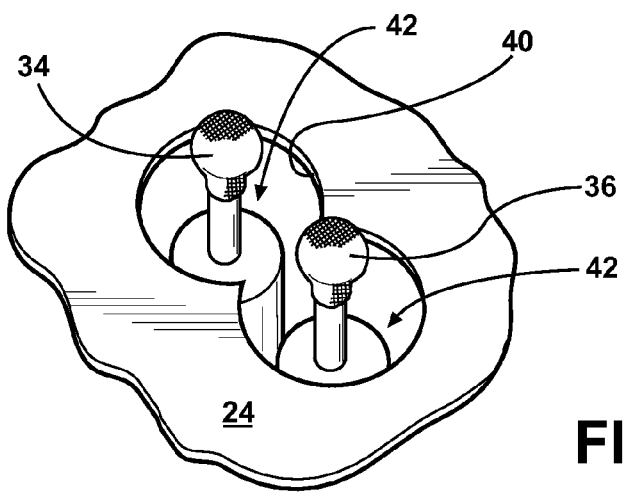
FIG. 4A is a partial perspective view of the fixture with the distributing and receiving probes extending from the fixture.
Figure 4B:
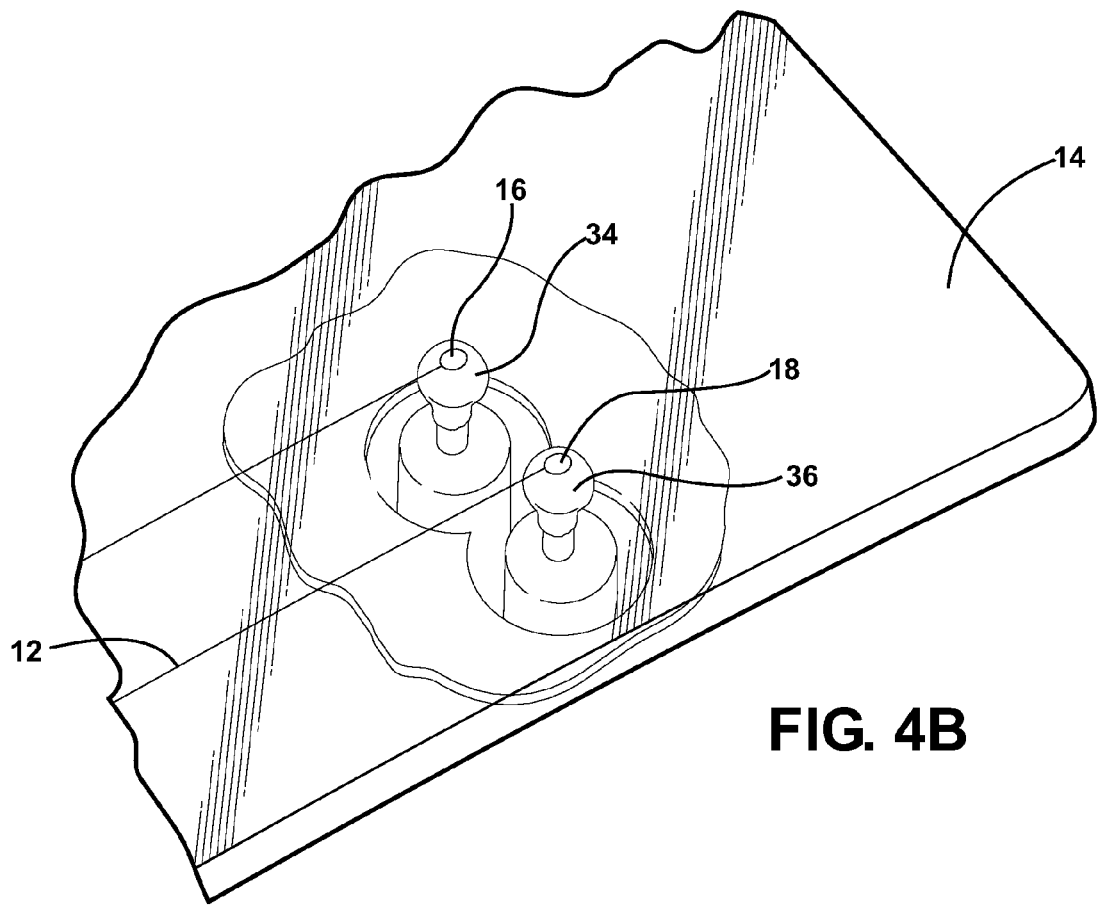
FIG. 4B is a partial perspective view of the window disposed on the fixture with the distributing and receiving probes extending from the fixture to contact the antenna.

Although not required, in one embodiment, the probes 34, 36 are disposed within the fixture 22. When the probes 34, 36 are disposed within the fixture 22, the probes 34, 36 are at least partially disposed within the hollow interior of the fixture 22. The probes 34, 26 may be fully disposed within the fixture 22 such that the contact end 38 of the probes 34, 36 are below the contact surface 24 as shown in FIG. 3A. When the probes 34, 36 are below the contact surface 24, the probes 34, 36 are moveable between a non-contact position where the probes 34, 36 are spaced from the antenna 12 (as shown in FIG. 3B), and a contact position where the probes 34, 36 are in contact with the antenna 12 (as shown in FIG. 4B). In the contact position, the distributing probe 34 extends from the fixture 22 to contact the first end 16 of the antenna 12 and the receiving probe 36 extends 16, 18 from the fixture 22 to contact the second end 18 of the antenna 12. As such, when the probes 34, 36 are below the contact surface 24, the contact surface 24 of the fixture 22 defines at least one hole 40 for allowing the probes 34, 36 to extend through the contact surface 24 of the fixture 22 to contact the antenna 12 on the window 14.

In an alternative embodiment, the probes 34, 36 are disposed within the depression defined by the contact surface 24 and extend from the contact surface 24 between the non-contact and contact positions. In another alternative embodiment, the probes 34, 36 are fixed on the contact surface 24 of the fixture 22 such that the probes 34, 36 contact the antenna 12 without having to extend. Said differently, the probes 34, 36 contact the antenna 12 as the window 14 is placed on the fixture 22 and are not movable between the non-contact and contact positions. It is also to be appreciated that the probes 34, 36 may be moveable relative to and along the contact surface 24 of the fixture 22 for allowing the probes 34, 36 to be manipulated relative to the fixture 22 to align the probes 34, 36 with the ends 16, 18 of the antenna 12 thereby allowing the fixture 22 to be adaptable to different patterns of the antenna 12. For example, the probes 34, 36 may be moveable relative to the fixture 22 for aligning with a first pattern of the antenna 12 on the window 14 and for aligning with another pattern of the antenna 12 different from the first pattern on a subsequent window.

Referring to FIGS. 2, 6 and 7, the antenna verification system 10 may include at least one actuator 42 coupled to the probes 34, 36 for moving the probes 34, 36 between the non-contact and the contact position. Examples of the actuator 42 suitable for the present invention include, but are not limited to, pneumatic cylinders, hydraulic cylinders, and electric motors. Typically, when the actuator 42 is employed, each of the probes 34, 36 are disposed within a respective one of the actuator 42. Said differently, the distributing probe 34 is disposed within the actuator 42 and the receiving probe 36 is disposed within another actuator 42. When the probes 34, 36 are disposed within the fixture 22, the actuator 42 is disposed within the hollow interior of the fixture 22 and aligned with the hole 40 defined by the contact surface 24 of the fixture 22. The actuator 42 moves the probes 34, 36 between the non-contact and the contact position such that the probes 34, 36 extend through the hole 40 defined by the contact surface 24 of the fixture 22. It is to be appreciated that the probes 34, 36 may be moved between the non-contact and the contact positions by any method without departing from the scope of the present invention.

When the antenna verification system 10 employs the actuator 42, the antenna verification system 10 may also include an actuator controller 43 in communication with the actuator 42 for activating the actuator 42 to move the probes 34, 36 between the non-contact and the contact position. The actuator controller 43 may be of any type suitable for moving the probes 34, 36. The actuator controller 43 may be disposed within the hollow interior of the fixture 22. Typically, at least one actuator wire 56 couples the actuator controller 43 and the actuator 42; however, the communication between the actuator controller 43 and the actuator 42 can be wireless.

Referring only to FIGS. 6 and 7, the antenna verification system 10 includes an indicator 44 in electrical communication with the receiving probe 36 for indicating passage of the electrical current from the antenna 12 to the receiving probe 36 to verify the completeness of the antenna 12. The indicator 44 may be disposed within the hollow interior of the fixture 22. Typically, at least one receiving probe wire 45 is used for coupling the receiving probe 36 to the indicator 44. The indicator 44 may be any suitable device for indicating the passage of the electrical current from the antenna 12 to the receiving probe 36 known in the art. For example, in one embodiment, the indicator 44 is a light source which emits light upon passage of the electrical current from the antenna 12 to the receiving probe 36. It is to be appreciated that the light source may be a pair of light sources such that a first light source generates a first color of light and a second light source generates a second color of light that is different from the first color of light. Generally, the first color of light is green and the second color of light is red. When the indicator 44 is the pair of light sources, the first light source will generate the first color of light if the electrical current passes from the antenna 12 to the receiving probe 36. Alternatively, the second light source will generate the second color of light if the electrical current does not pass from the antenna 12 to the receiving probe 36. The light source may be coupled to a light board for providing a central location for an operator to view the light source. As such, based on the color of light generated by the light sources the operator will verify if the antenna 12 is complete. Alternatively, in another embodiment, the indicator 44 is a multimeter as is known in the art.

Generally, as the electrical current passes from the current source 32 through the distributing probe 34 and the antenna 12, the initial voltage of the electrical current experiences a normal loss due to an impedance or resistance of the antenna 12, depending on the type of current source 32 i.e., alternating current or direct current. For alternating current, the normal loss is due to the impedance of the antenna 12 and for direct current the normal loss is due to the resistance of the antenna 12. As such, the receiving probe 36 receives a subsequent voltage of the electrical current after the initial voltage experiences the normal loss. Generally, an expected range of the normal loss can be determined which provides an expected range of the subsequent voltage of the electrical current when the antenna 12 is complete. For example, if the antenna 12 is complete, the subsequent voltage of the electrical current is approximately the initial voltage minus the expected range of the normal loss. However, if the antenna 12 is not complete, the subsequent voltage of the antenna 12 will be significantly lower than the initial voltage minus the expected range of the normal loss. For example, if the antenna 12 has a break in the pattern and is not complete, the electrical current will not pass the break and the receiving probe 36 will not receive the electrical current. It is to be appreciated that other losses of the electrical current may occur and the range of the subsequent voltage of the electrical current factors in the other losses.

Comparing the initial voltage and the subsequent voltage of the electrical current determines the electrical continuity of the antenna 12 and thus the completeness of the antenna 12. The electrical continuity has an acceptable range such that if the electrical continuity is within the acceptable range, the antenna 12 is considered to be complete and the widow is acceptable for installation in the vehicle. Alternatively, if the electrical continuity is not within the acceptable range, the antenna 12 is considered incomplete and the window 14 is defective and not acceptable for installation in the vehicle. As such, if the window 14 is acceptable, it is shipped to the vehicle manufacturer or installed on the vehicle. Alternatively, if the window 14 is defective, it cannot be shipped to the vehicle manufacturer or installed on the vehicle.

When the indicator 44 is the light source, the light source only indicates passage of the electrical current from the antenna 12 to the receiving probe 36 and cannot determine the difference between the initial voltage and the subsequent voltage. The multimeter can determine the difference between the initial voltage and the subsequent voltage which is more accurate at indicating the electrical continuity of the antenna 12 as compared to the light source. It is to be appreciated that the multimeter and the light source may be integral such that the multimeter signals the light source if the electrical continuity of the antenna 12 is within the acceptable range.

The antenna verification system 10 may also include a central processing unit 46 for communicating with the antenna verification system 10. When employed, the central processing unit 46 may be disposed within the hollow interior of the fixture 22. It is to be appreciated that the central processing unit 46 may be of any suitable type known in the art. The central processing unit 46 may include at least one input device, such as a keyboard and/or a mouse and may be in communication with at least one monitor. It is to be appreciated that the central processing unit 46 may include other components such as a controller without departing from the scope of the present invention.

When employed, the central processing unit 46 may be in communication with the indicator 44 for receiving an indication that the electrical current has passed from the antenna 12 to the receiving probe 36 to verifying the completeness of the antenna 12. When the indicator 44 is in communication with the central processing unit 46, the central processing unit 46 may determine the electrical continuity of the antenna 12 based on the electrical current measured by the indicator 44. The central processing unit 46 may also verify the completeness of the antenna 12 based on the indication that the electrical current has passed from the antenna 12 to the receiving robe 36. The central processing unit 46 may also verify the completeness of the antenna 12 based on the determination of the electrical continuity of the antenna 12. Typically an indicator wire 47 couples the central processing unit 46 and the indicator 44; however, the communication between the central processing unit 46 and the indicator 44 can be wireless. The central processing unit 46 may display results of the determination of the electrical continuity and the completeness of the antenna 12 on the monitor for viewing by the operator. It is to be appreciated that the indicator 44 and the central processing unit 46 may be integral such that that central processing unit 46 is in communication with the receiving probe 36 for indicating passage of the electrical current from the antenna 12 to the receiving probe 36.

Additionally, when employed, the central processing unit 46 may be in communication with the current source 32 for activating the current source 32 to generate the electrical current. Typically, when the current source 32 is in communication with the central processing unit 46, a current source wire 48 couples the central processing unit 46 and the current source 32; however, the communication between the central processing unit 46 and the current source 32 can be wireless.

Furthermore, when employed, the central processing unit 46 may be in communication with the actuator 42 such that the central processing unit 46 can activate the actuator 42 for moving the probes 34, 36 between the non-contact and the contact positions. Alternatively, when the actuator controller 43 is employed, the central processing unit 46 may be in communication with the actuator controller 43 for moving the probes 34, 36. It is to be appreciated that the actuator controller 43 may be integral with the central processing unit 46 such that the central processing unit 46 is the actuator controller 43. Typically, an actuator wire 50 couples the central processing unit 46 to the actuator controller 43 for allowing the central processing unit 46 to communicate with the actuator 42 through the actuator controller 43. It is to be appreciated that the central processing unit 46 and the actuator 42 may communicate directly without the actuator controller 43. It is also to be appreciated that the central processing unit 46 may communicate wirelessly with the actuator 42 or, when employed, with the actuator controller 43.

The antenna verification system 10 may include at least one sensor 52 for sensing a presence of the window 14 on the fixture 22. The sensor 52 may be of any suitable type of sensor for sensing the presence of the window 14 on the fixture 22. For example, the sensor 52 may be a contact sensor which is depresses by the window 14 as the window 14 is placed on the fixture 22. Alternatively, the sensor 52 may be a non-contact sensor such as a laser or photo eye for sensing the presence of the window 14. In one embodiment, the sensor 52 is disposed within the hollow interior of the fixture 22 for positioning the sensor 52 adjacent the contact surface 24 of the fixture 22. When the sensor 52 is disposed within the fixture 22, the contact surface 24 of the fixture 22 defines at least one aperture 55 for allowing the sensor 52 to sense the presence of the window 14 through the contact surface 24 of the fixture 22.

When the central processing unit 46 and the sensor 52 are employed, the sensor 52 communicates with the central processing unit 46 for communicating the presence of the window 14 to the central processing unit 46. Typically, the sensor 52 is in communication with the central processing unit 46 for transmitting a signal indicating the presence of the window 14 to the central processing unit 46. Typically, at least one sensor wire 53 couples the sensor 52 and the central processing unit 46.

The antenna verification system 10 also includes at least one adjustment mechanism 54 disposed adjacent the fixture 22 for aligning the distributing probe 34 and the first end 16 of the antenna 12 and for aligning the receiving probe 36 and the second end 18 of the antenna 12. It is to be appreciated that the adjustment mechanism 54 can be of any suitable device known in the art. For example, in one embodiment, the adjustment mechanism 54 includes a finger 60 extending from an adjustment actuator 58. Typically, the adjustment actuator 58 is in communication with the actuator controller 43. After the window 14 is placed on the fixture 22, the adjustment actuator 58 is activated for extending the finger 60 into contact with the window 14 to manipulate the window 14 into the test position on the fixture 22.

When employed, the central processing unit 46 may communicate with the adjustment mechanism 54 for controlling the adjustment mechanism 54 to move the window 14 disposed on the fixture 22 into the test position based on the presence of the window 14 communicated by the sensor 52. The central processing unit 46 may also control the adjustment mechanism 54 to automatically sort the window 14 based on the completeness on the antenna 12. Typically, at least one adjustment mechanism wire 62 couples the adjustment mechanism 54 to the actuator controller 43 for allowing the central processing unit 46 to communicate with the adjustment mechanism 54. It is to be appreciated that the central processing unit 46 may communicate directly with the adjustment mechanism 54. It is also to be appreciated that the central processing unit 46 and the adjustment mechanism 54 may communicate wirelessly.

The antenna verification system 10 may also include at least one transporting mechanism 64 disposed adjacent the fixture 22 for placing the window 14 on and removing the window 14 from the fixture 22. For example, the transporting mechanism 64 may be a conveyor system and/or a robotic arm. Additionally, the transporting mechanism 64 may be in communication with the central processing unit 46 for automatically sorting the window 14 based on the completeness of the antenna 12. Typically, at least one transporting wire 68 couples the transporting mechanism 64 and the central processing unit 46; however, the communication between the transporting mechanism 64 and the central processing unit can 46 can be wireless. It is to be appreciated the transporting mechanism 64 may be integral with the adjustment mechanism 54 thereby allowing the window 14 to be placed on the fixture 22 and aligned into the test position either sequentially or simultaneously.

It is to be appreciated that the general concept of the present invention is to provide the method of verifying the completeness of the antenna 12. Certain steps in the method of verifying the completeness of the antenna 12 can be manual. More preferably, the method of verifying the completeness of the antenna 12 can be an automated method for incorporation into an assembly line. Most preferably, the method of verifying the completeness of the antenna 12 can be a fully automated method. There are several advantages of the antenna verification system 10. One such advantage is the antenna verification system 10 can be automated which allows for the verification of the completeness of every antenna 12 on every window 14 before shipping the window 14 to the vehicle manufacturer and/or installation on the vehicle.

It is to be appreciated that although the method set forth below measures the electrical continuity of the antenna 12 to verify if the antenna 12 is complete, there are several techniques that could be used to verify that the antenna 12 is complete, such as measuring the impedance or measuring the resistance of the antenna 12 without departing from the scope of the present invention. It is also to be appreciated that the antenna verification system 10 may include software necessary to complete the verification of the completeness of the antenna 12.

The following is an explanation of the method of using the antenna verification system 10 and is for explanatory purposes only and is not intended to be limiting in any way.

The method of verifying the completeness of the antenna 12 disposed on the window 14 uses the antenna verification system 10 and comprising the step of placing the window 14 on the fixture 22. The step of placing the window 14 on the fixture 22 may be manually completed or automated. When automated, the step of placing the window 14 on the fixture 22 is further defined as automatically placing the window 14 on the fixture 22. Additionally, when the antenna verification system 10 include the transporting mechanism 64, the step of placing the window 14 on the fixture 22 may be further defined as activating the transporting mechanism 64 to automatically place the window 14 on the fixture 22.

The method also includes the steps of automatically aligning the distributing probe 34 and the first end 16 of the antenna 12 and automatically aligning the receiving probe 36 and the second end 18 of the antenna 12. It is to be appreciated that the step of placing the window 14 on the fixture 22 may be performed simultaneously with the steps of automatically aligning the distributing and receiving probes 34, 36. The distributing and receiving probes 34, 36 may be automatically aligned by moving the window relative to the fixture. Alternatively, the distributing and receiving probes 34, 36 may be automatically aligned by moving the probes 34, 36 themselves. Additionally, when the adjustment mechanism 54 and the central processing unit 46 are employed, the steps of automatically aligning the distributing and receiving probes 34, 36 may be further defined as activating the adjustment mechanism 54 with the central processing unit 46 to automatically align the distributing and receiving probes 34, 36.

The method may also include the step of sensing a presence of the window 14 on the fixture 22 with the sensor 52. The method further includes the step of activating the current source 32 such that the electrical current passes from the distributing probe 34 to antenna 12. When the central processing unit 46 and the sensor are employed 52, the step of activating the current source may be further defined as activating the current source with the central processing unit 46 upon sensing the presence of the window 14 such that the electrical current passes from the distributing probe 34 to the antenna 12.

The method also includes the step of indicating passage of the electrical current from the antenna 12 to the receiving probe 36 with the indicator 44 to verify a completeness of the antenna 12. It is to be appreciated that the method may further comprise the step of extending the probes 34, 36 from the non-contact position to the contact position to bring the probes 34, 36 into contact with the antenna 12. When included in the method, the step of extending the probes 34, 36 may be further defined as activating the actuator 42 to extend the probes 34, 36 from the non-contact position to the contact position. When the central processing unit 46 is employed, the method may comprise the step of controlling the adjustment mechanism 54 with the central processing unit 46. Additionally, the method may also comprise the step of activating the current source 32 with the central processing unit 46 such that the electrical current passes from the distributing probe 34 to the antenna 12.

The method may further include the step of sorting the window 14 based on the completeness of the antenna 12. The step of sorting the window 14 may be further defined as automatically sorting the window 14 with the transporting mechanism 64 based on the completeness of the antenna 12.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention.

What is claimed is:

1. A method of verifying a completeness of an antenna disposed on a window using an antenna verification system, wherein the antenna is electrically conductive and has a first end and a second end spaced from each other, the antenna verification system comprising a fixture having a support surface for supporting the window and having a hollow interior opposite the support surface, a current source for generating an electrical current, at least one distributing probe disposed within the hollow interior of the fixture and in electrical communication with the current source, at least one receiving probe disposed within the hollow interior of the fixture, and an indicator in electrical communication with the receiving probe for indicating passage of the electrical current from the antenna to the receiving probe, said method comprising the steps of:
    placing the window on the fixture;
    automatically aligning the distributing probe and the first end of the antenna;
    automatically aligning the receiving probe and the second end of the antenna;
    extending the distributing probe from the hollow interior of the fixture into contact with the first end of the antenna to electrically communicate with the first end of the antenna;
    extending the receiving probe from the hollow interior of the fixture into contact with the second end of the antenna to electrically communicate with the second end of the antenna;
    activating the current source such that the electrical current passes from the distributing probe to the antenna; and
    indicating passage of the electrical current from the antenna to the receiving probe with the indicator to verify a completeness of the antenna.

2. A method as set forth in claim 1 wherein the distributing and receiving probes are automatically aligned by moving the window relative to the fixture.

3. A method as set forth in claim 2 wherein the antenna verification system further comprises at least one adjustment mechanism disposed adjacent the fixture which manipulates the window to move the window relative to the fixture and automatically aligning the distributing and receiving probes.

4. A method as set forth in claim 3 wherein the antenna verification system further comprises a central processing unit in communication with the adjustment mechanism and said method further comprises the step of controlling the adjustment mechanism with the central processing unit.

5. A method as set forth in claim 1 wherein the antenna verification system further comprises at least one transporting mechanism disposed adjacent the fixture and the step of placing the window on the fixture is further defined as activating the transporting mechanism to automatically place the window on the fixture.

6. A method as set forth in claim 1 wherein the step of placing the window on the fixture is performed simultaneously with the steps of automatically aligning the distributing and receiving probes.

7. A method as set forth in claim 1 wherein the probes moveable between a non-contact position where the probes are within said hollow interior of said fixture and spaced from the antenna and a contact position where the probes extend from said fixture and contact the antenna.

8. A method as set forth in claim 7 wherein the antenna verification system further comprises at least one actuator coupled to the probes and the step of extending the probes from the non-contact position to the contact position is further defined as activating the actuator to extend the probes from the non-contact position to the contact position.

9. A method as set forth in claim 1 further comprising the step of sorting the window based on the completeness of the antenna.

10. A method as set forth in claim 9 wherein the antenna verification system further comprises at least one transporting mechanism disposed adjacent the fixture and the step of sorting the window based on the completeness of the antenna is further defined as automatically sorting window with the transporting mechanism based on the completeness of the antenna.

11. A method as set forth in claim 1 wherein the antenna verification system further comprises a central processing unit and at least one sensor in communication with the central processing unit for sensing a presence of the window on the fixture and said method further comprises the step of activating the current source with the central processing unit upon sensing the presence of the window such that the electrical current passes from the distributing probe to the antenna.

12. An antenna verification system for verifying a completeness of an antenna disposed on a window, wherein the antenna is electrically conductive and has a first end and a second end spaced from each other, said system comprising:
    a fixture having a contact surface for supporting the window and having a hollow interior opposite said contact surface;
    a current source for generating an electrical current;
    at least one distributing probe disposed within said hollow interior of said fixture and extendable from said fixture for contacting the first end of the antenna with said distributing probe in electrical communication with said current source for electrically communicating with the first end of the antenna to pass electrical current to the first end of the antenna;
    at least one receiving probe disposed within said hollow interior of said fixture and extendable from said fixture for contacting the second end of the antenna to electrically communicate with the second end of the antenna to receive the electrical current which is passed through the antenna;
    an indicator in electrical communication with said receiving probe for indicating passage of electrical current from the antenna to said receiving probe to verify the completeness of the antenna; and
    at least one adjustment mechanism disposed adjacent said fixture for aligning said distributing probe and the first end of the antenna and for aligning said receiving probe and the second end of the antenna.

13. An antenna verification system as set forth in claim 12 wherein said probes are moveable between a non-contact position where said probes are within said hollow interior of said fixture and spaced from the antenna and a contact position where said probes extend from said fixture and contact the antenna.

14. An antenna verification system as set forth in claim 13 further comprising at least one actuator coupled to said distributing and receiving probes for moving said distributing and receiving probes between said non-contact position and said contact position.

15. An antenna verification system as set forth in claim 12 further comprising a central processing unit in communication with said indicator for verifying the completeness of the antenna based on passage of electrical current from the antenna to said receiving probe.

16. An antenna verification system as set forth in claim 15 further comprising at least one sensor in communication with said central processing unit for sensing a presence of the window on said fixture.

17. An antenna verification system as set forth in claim 16 wherein said central processing unit is also in communication with said current source for activating said current source to generate electrical current.

18. An antenna verification system as set forth in claim 15 further comprising at least one transporting mechanism in communication with said central processing unit for automatically sorting the window based on the completeness of the antenna.

19. An antenna verification system as set forth in claim 15 wherein said indicator is selected from a multimeter and a light source which emits light upon passage of electrical current from the antenna to said receiving probe.

20. An antenna verification system for verifying a completeness of an antenna disposed on a window, wherein the antenna is electrically conductive and has a first end and a second end spaced from each other, said system comprising:
    a fixture having a contact surface for supporting the window and a hollow interior opposite said contact surface;
    a current source for generating an electrical current;
    a central processing unit in communication with said current source for activating said current source to generate the electrical current;
    at least one distributing probe disposed within said hollow interior of said fixture and extendable from said fixture for contacting the first end of the antenna with said distributing probe in electrical communication with said current source for electrically communicating with the first end of the antenna to pass electrical current to the first end of the antenna;
    at least one receiving probe disposed within said hollow interior of said fixture and extendable from said fixture for contacting the second end of the antenna to electrically communicate with the second end of the antenna to receive electrical current which is passed through the antenna;
    said probes being moveable between a non-contact position where said probes are within said hollow interior of said fixture and spaced from the antenna and a contact position where said probes extend from said fixture and contact the antenna;
    at least one sensor in communication with said central processing unit for communicating the presence of the window to said central processing unit;
    at least one adjustment mechanism disposed adjacent said fixture for automatically aligning said distributing probe and the first end of the antenna and for automatically aligning said receiving probe and the second end of the antenna, said adjustment mechanism in communication with said central processing unit for controlling said adjustment mechanism based on the presence of the window communicated by said sensor;
    an indicator in electrical communication with said receiving probe for indicating passage of electrical current from the antenna to said receiving probe, with said indicator in communication with said central processing unit for verifying the completeness of the antenna based on passage of electrical current from the antenna to said receiving probes.

21. An antenna verification system as set forth in claim 20 further comprising at least one actuator coupled to said probes for moving said probes between said non-contact position and said contact position, said actuator in communication with said central processing unit for activating the actuator to move said probes between said non-contact position and said contact position.

22. An antenna verification system as set forth in claim 20 further comprising at least one transporting mechanism in communication with said central processing unit for sorting the window based on the completeness of the antenna.

23. An antenna verification system as set forth in claim 20 wherein said indicator is selected from a multimeter and a light source which emits a light upon passage of the electrical current from the antenna to said receiving probe.

24. A method of verifying a completeness of an antenna disposed on a window using an antenna verification system, wherein the antenna is electrically conductive and has a first end and a second end spaced from each other, the antenna verification system comprising a fixture having a support surface for supporting the window and defining a hollow interior, a current source for generating an electrical current, a central processing unit in communication with the current source, at least one distributing probe disposed within the hollow interior of the fixture and in electrical communication with the current source, at least one receiving probe disposed within the hollow interior of the fixture, at least one actuator in communication with the central processing unit and coupled to the probes for moving the probes between a non-contact position where the probes are within said hollow interior of said fixture and spaced from the antenna and a contact position where the probes extend from said fixture and contact the antenna, at least one sensor in communication with the central processing unit, at least one adjustment mechanism in communication with the central processing unit, an indicator in electrical communication with the receiving probe for indicating passage of the electrical current from the antenna to the receiving probe and in communication with the central processing unit, said method comprising the steps of:
    placing the window on the fixture;
    sensing the presence of the window on the fixture with the sensor;
    communicating the presence of the window on the fixture from the sensor to the central processing unit;
    activating the adjustment mechanism with the central processing unit to automatically align the distributing probe and the first end of the antenna;
    activating the adjustment mechanism with the central processing unit to automatically align the receiving probe and the second end of the antenna;

activating the actuator with the central processing unit to extend the probes from the non-contact position within the hollow interior of the fixture to the contact position such that the probes contact the ends of the antenna to electrically communicate with the ends of the antenna;

activating the current source with the central processing unit such that the electrical current passes from the distributing probe to the receiving probe through the antenna;

indicating passage of the electrical current from the antenna to the receiving probe with the indicator;

communicating passage of the electrical current to the central processing unit;

verifying the completeness of the antenna with the central processing unit;

retracting the probes from the contact position to the non-contact position;

removing the window from the fixture; and sorting the window based on the completeness of the antenna.

25. A method as set forth in claim 24 wherein the antenna verification system further comprises at least one transporting mechanism and the step of placing the widow on the fixture is further defined as automatically placing the window on the fixture with the transporting mechanism.

26. A method as set forth in claim 24 wherein the step of placing the window on the fixture is performed simultaneously with the step of automatically aligning the distributing and receiving probes.

* * * * *